US012740079B2

(12) United States Patent
Chang et al.

(10) Patent No.: US 12,740,079 B2
(45) Date of Patent: Sep. 15, 2026

(54) TRENCH FET DEVICE AND METHOD OF MANUFACTURING TRENCH FET DEVICE

(71) Applicant: Huawei Technologies Co., Ltd., Shenzhen (CN)

(72) Inventors: Mo huai Chang, Nuremberg (DE); Junqing He, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 384 days.

(21) Appl. No.: 18/532,619

(22) Filed: Dec. 7, 2023

(65) Prior Publication Data

US 2024/0113186 A1 Apr. 4, 2024

Related U.S. Application Data

(63) Continuation of application No. PCT/CN2021/137484, filed on Dec. 13, 2021.

(51) Int. Cl.

*H10D 12/00* (2025.01)
*H10D 12/01* (2025.01)
*H10D 64/00* (2025.01)

(52) U.S. Cl.

CPC ......... *H10D 12/415* (2025.01); *H10D 12/038* (2025.01); *H10D 64/117* (2025.01)

(58) Field of Classification Search

CPC ............... H10D 64/513; H10D 30/665; H10D 30/0297; H10D 30/668; H10D 62/127; H10D 64/117; H10D 12/032; H10D 12/035; H10D 12/038; H10D 12/415; H10D 64/025; H10D 64/027; H10D 64/111; H10D 64/112

See application file for complete search history.

(56) References Cited

U.S. PATENT DOCUMENTS 7,638,841 B2 12/2009 Challa
10,103,257 B1 10/2018 Qin et al.
2005/0001268 A1* 1/2005 Baliga .................... H10D 30/65 257/E29.256
2007/0155104 A1* 7/2007 Marchant ............ H10D 30/665 257/E29.136
2011/0018058 A1 1/2011 Disney
2015/0194495 A1 7/2015 Azam et al.
2016/0064548 A1 3/2016 Laforet et al.

(Continued)

OTHER PUBLICATIONS

Zia Hossain et al., “Process & Design Impact on BVDSS Stability of a Shielded Gate Trench Power MOSFET”, Jun. 15-19, 2014, total 4 pages.

(Continued)

*Primary Examiner* — Eduardo A Rodela
(74) *Attorney, Agent, or Firm* — Conley Rose, P.C.

(57) ABSTRACT

A trench field-effect transistor (FET) device includes a plurality of active trenches extending along a first axis and distributed along a second axis perpendicular to the first axis. Each active trench includes a gate electrode and a shield electrode. The trench FET device further includes a plurality of termination trenches fully filled with a dielectric material, extending along the second axis, and arranged adjacent to the active trenches. In addition, the shield electrode of each of the active trenches abuts a respective one of the plurality of termination trenches at each end.

20 Claims, 8 Drawing Sheets

(56) References Cited

U.S. PATENT DOCUMENTS

| | | | | |
|---|---|---|---|---|
| 2016/0104766 | A1 | 4/2016 | Kelkar et al. | |
| 2019/0006513 | A1 | 1/2019 | Ouvrard et al. | |
| 2019/0081173 | A1* | 3/2019 | Nishiwaki | H10D 62/105 |
| 2020/0273987 | A1* | 8/2020 | Zeng | H10D 30/0295 |
| 2020/0312975 | A1 | 10/2020 | Fukuda et al. | |
| 2020/0357917 | A1* | 11/2020 | Zundel | H10D 30/668 |
| 2021/0043741 | A1* | 2/2021 | Hu | H10D 64/117 |
| 2021/0083096 | A1* | 3/2021 | Mirchandani | H10D 30/665 |
| 2023/0187537 | A1* | 6/2023 | Woo | H10D 30/668<br>438/270 |
| 2023/0253468 | A1* | 8/2023 | Hossain | H10D 64/118<br>257/330 |
| 2023/0343867 | A1* | 10/2023 | Hsieh | H10D 62/112 |

OTHER PUBLICATIONS

Zia Hossain et al., “3-D TCAD Simulation to Optimize the Trench Termination Design for Higher and Robust BVDSS”, Jun. 12-16, 2016, total 4 pages.

* cited by examiner

FORMING EPITAXIAL LAYER ON SUBSTRATE
202

REMOVING MATERIAL FROM EPITAXIAL LAYER TO FORM PLURALITY OF ACTIVE TRENCHES EXTENDING ALONG FIRST AXIS AND DISTRIBUTED ALONG SECOND AXIS PERPENDICULAR TO FIRST AXIS, AND TWO OR MORE TERMINATION TRENCHES EXTENDING ALONG SECOND AXIS AND ARRANGED ADJACENT TO ACTIVE TRENCHES
204

FULLY FILLING TERMINATION TRENCHES WITH DIELECTRIC MATERIAL
206

FORMING GATE ELECTRODE AND SHIELD ELECTRODE IN EACH ACTIVE TRENCH, WHEREIN SHIELD ELECTRODE OF EACH OF ACTIVE TRENCHES IS ARRANGED TO ABUT WITH RESPECTIVE ONE OF TERMINATION TRENCHES AT EACH END
208

FIG. 2

TRENCH FET DEVICE AND METHOD OF MANUFACTURING TRENCH FET DEVICE

CROSS-REFERENCE TO RELATED APPLICATIONS

This is a continuation of International Patent Application No. PCT/CN2021/137484 filed on Dec. 13, 2021, which is hereby incorporated by reference in its entirety.

TECHNICAL FIELD

The present disclosure relates generally to the field of semiconductor devices and in particularly, to a trench field-effect transistor (FET) device and a method of manufacturing the trench FET device, for example a field oxide edge termination trench for the FET device and a method of manufacturing of the field oxide edge termination trench.

BACKGROUND

Generally, semiconductor devices, such as a trench metal oxide semiconductor device (e.g., a shielded-gate trench FET), include an active region, and an edge termination region. Moreover, a trench termination with a termination structure is also placed around the periphery of the active region (i.e., a die active area) of the conventional semiconductor devices. In addition, there exists a three-directional charge balance (i.e., three-dimensional (3D) depletion interaction) in the termination structure. Due to this, an optimized transition region (i.e., a direct current gap) may be required in the conventional semiconductor devices to assure charge balance in the transition region where active trenches are terminating to trench termination. Because, if the transition region is not properly optimized, then it can affect the voltage blocking capability, thereby causing breakdown voltage (BVdss) clamping, BVdss instability, and potentially affect unclamped inductive switching capability of the conventional semiconductor devices.

Certain attempts have been made to optimize the transition region in the conventional semiconductor devices, for example, by performing technology computer-aided design (TCAD)-based simulation followed by verification of simulation results using a real design and process to attempt some form of optimization in design and manufacturing. However, such attempts are time-consuming and also require a lot of research and development resources, which has an uncertainty of success. Due to which there exists a technical problem of how to improve the voltage blocking capability effectively and efficiently in semiconductor devices.

Therefore, in light of the foregoing discussion, there exists a need to overcome the aforementioned drawbacks associated with the conventional semiconductor devices.

SUMMARY

The present disclosure provides a trench FET device and a method of manufacturing the trench FET device. The present disclosure provides a solution to the existing problem of how to improve the voltage blocking capability effectively and efficiently in semiconductor devices. An objective of the present disclosure is to provide a solution that overcomes at least partially the problems encountered in other approaches and provides an improved trench FET device and an improved method of manufacturing the trench FET device with an improved voltage blocking capability.

One or more objectives of the present disclosure is achieved by the solutions provided in the enclosed independent claims. Advantageous implementations of the present disclosure are further defined in the dependent claims.

In one aspect, the present disclosure provides a trench FET device comprising a plurality of active trenches extending along a first axis and distributed along a second axis perpendicular to the first axis, each active trench comprising a gate electrode and a shield electrode, and two or more termination trenches extending along the second axis and arranged adjacent to the plurality of active trenches, wherein the shield electrode of each of the plurality of active trenches is arranged to abut with a respective one of the two or more termination trenches at each end, and wherein the two or more termination trenches are fully filled with a dielectric material.

The trench FET device improves its voltage blocking capability, where the two or more termination trenches are used to increase the voltage blocking capability of the trench FET device. Moreover, the trench FET device is based on an edge termination concept that offers the benefit of eliminating the need for a transition region. Further, each active trench from the plurality of active trenches of the trench FET device includes the gate electrode and the shield electrode that is used to reduce a gate-drain capacitance.

In an implementation form, one or more of the plurality of active trenches comprises an end region extending beyond the abutting termination trench, wherein the end region is fully filled with the dielectric material.

The dielectric material filled within the end region is useful to influence an electrical field potential from the plurality of active trenches at an intersection point of the trench FET device.

A method of manufacturing a trench FET device. The method comprising forming an epitaxial layer on a substrate, removing material from the epitaxial layer to form a plurality of active trenches extending along a first axis and distributed along a second axis perpendicular to the first axis, and two or more termination trenches extending along the second axis and arranged adjacent to the plurality of active trenches, fully filling the two or more termination trenches with dielectric material, and forming a gate electrode and a shield electrode in each active trench, wherein the shield electrode of each of the active trenches is arranged to abut with a respective one of the termination trenches at each end.

The method achieves all the advantages and technical effects of the trench FET device of the present disclosure.

It is to be appreciated that all the aforementioned implementation forms can be combined.

It has to be noted that all devices, elements, circuitry, units, and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof. It will be appreciated that features of the present disclosure are susceptible to being combined in various combinations without departing from the scope of the present disclosure as defined by the appended claims.

Additional aspects, advantages, features and objects of the present disclosure would be made apparent from the drawings and the detailed description of the illustrative implementations construed in conjunction with the appended claims that follow.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams:

FIG. 2 is a flow chart of a method of manufacturing a trench FET device, in accordance with an embodiment of the present disclosure;

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

Figure 1A:
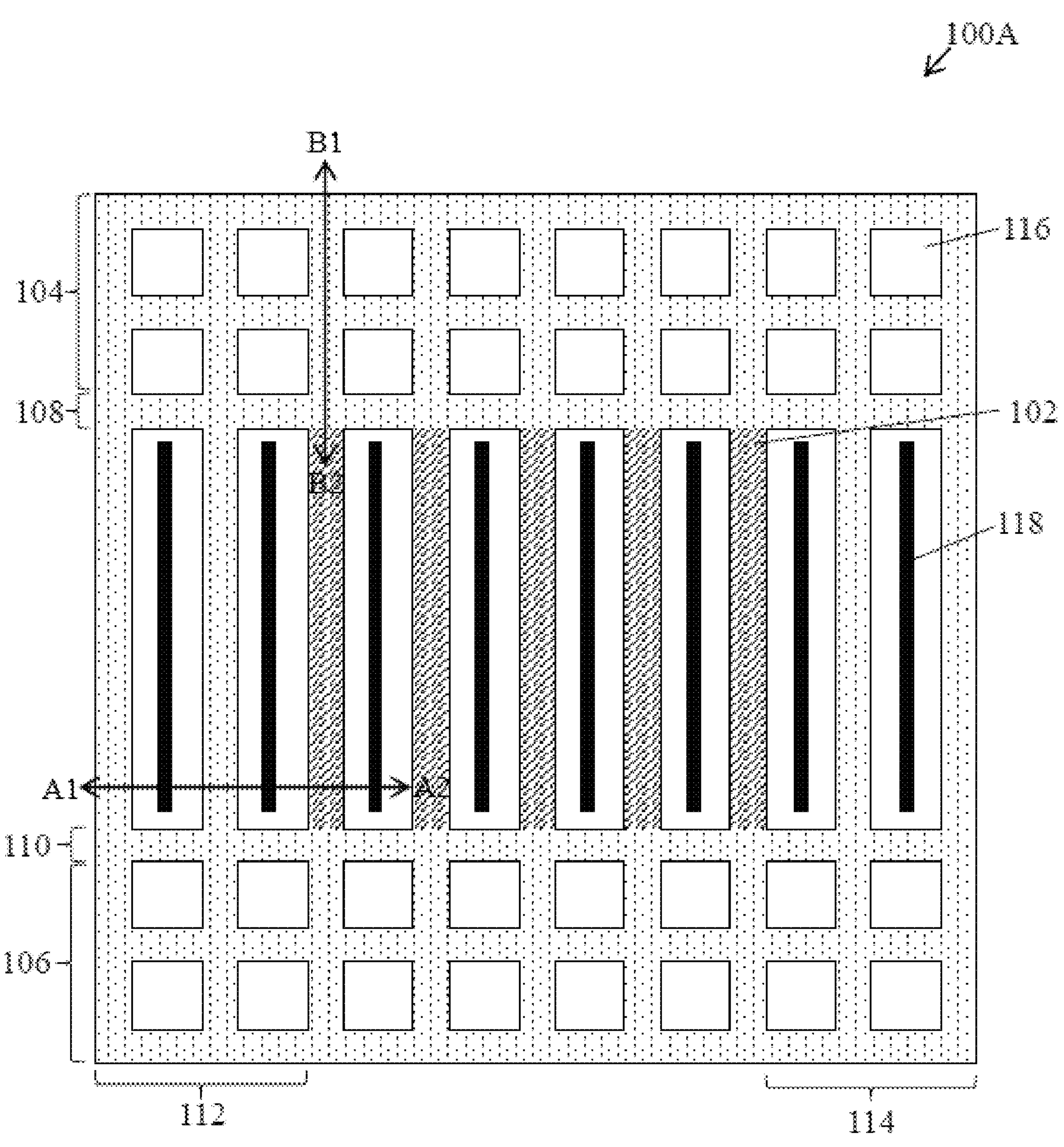
FIG. 1A is an illustration of a trench FET device, in accordance with an embodiment of the present disclosure.

FIG. 1A is an illustration of a trench FET device, in accordance with an embodiment of the present disclosure. With reference to FIG. 1A there is shown a trench FET device 100A that includes a plurality of active trenches 102, and two or more termination trenches 104 and 106. In an implementation, the trench FET device 100A further includes at least one additional termination trench 108 and 110, one or more parallel termination trenches 112 and 114, one or more vertices 116, and a source contact 118.

The trench FET device 100A is based on an edge termination concept that offers the benefit of eliminating the need for a transition region. The trench FET device 100A includes the plurality of active trenches 102 that extends along a first axis (e.g., B1-B2 as shown in FIG. 1A) and are also distributed along a second axis (e.g., A1-A2 of FIG. 1A) that is perpendicular to the first axis. Each active trench from the plurality of active trenches 102 includes a gate electrode and a shield electrode. An example of the gate electrode and the shield electrode is shown and described, for example, in FIG. 1B. Moreover, the plurality of active trenches 102 are terminated directly to the two or more termination trenches 104 and 106 that are included in the trench FET device 100A.

The two or more termination trenches 104 and 106 extend along the second axis and are arranged adjacent to the plurality of active trenches 102. The two or more termination trenches 104 and 106 are used to increase the voltage blocking capability of the trench FET device 100A. Each termination trenches from the two or more termination trenches 104 and 106 that are directly connected to the plurality of active trenches 102 are filled with a thick field oxide.

At least one additional termination trench 108 and 110, and one or more parallel termination trenches 112 and 114 are similar to the two or more termination trenches 104 and 106, and configured to perform similar or same functions. Moreover, one or more vertices 116 are formed at an intersection between an active trench and a termination trench. In an example, one or more vertices 116 are formed with a rounded (e.g., circular) form or angled (e.g., square, hexagonal, or diamond) form. The source contact 118 is a contact line. In an example, the source contact 118 is a tungsten contact line.

The trench FET device 100A includes the plurality of active trenches 102 that extend along the first axis and are also distributed along the second axis that is perpendicular to the first axis, and each active trench includes the gate electrode and the shield electrode. The trench FET device 100A further includes two or more termination trenches 104 and 106 extending along the second axis and arranged adjacent to the plurality of active trenches 102. In an example, the trench FET device 100A includes five active trenches that extend along the first axis and are also distributed along the second axis, as shown, for example, in FIG. 1A.

Beneficially, as compared to the conventional approach, the plurality of active trenches 102 are terminated directly to the two or more termination trenches 104 and 106 that extend along the second axis and are arranged adjacent to the plurality of active trenches 102. Moreover, the two or more termination trenches 104 and 106 are used to increase the voltage blocking capability of the trench FET device 100A. As a result, the trench FET device 100A offers the benefit of eliminating the need for a transition region. In addition, each active trench from the plurality of active trenches 102 of the trench FET device 100A includes the gate electrode and the shield electrode that is used to reduce a gate-drain capacitance.

The two or more termination trenches 104 and 106 are fully filled with a dielectric material. In an implementation, only a termination trench from the two or more termination trenches 104 and 106 that is directly connected to the plurality of active trenches 102 and also filled with the dielectric material (e.g., a thick field oxide). In an example, the trench FET device 100A needs just one extra mask to manufacture the two or more termination trenches 104 and 106 that are filled with the dielectric material. The two or more termination trenches 104 and 106 that are fully filled with the dielectric material are beneficial to increase voltage blocking capability of the trench FET device 100A, and also to influence (i.e., support) an electrical field potential from the plurality of active trenches 102 at an intersection point of the trench FET device 100A. In an example, one or more vertices 116 are also formed at an intersection between an active trench and a termination trench.

In an implementation, a depth of the two or more termination trenches 104 and 106 is equal to or greater than a depth of the plurality of active trenches 102. In another implementation, the depth of the two or more termination trenches 104 and 106 is equal to the depth of the plurality of active trenches 102. In yet another implementation, the depth of the two or more termination trenches 104 and 106 is greater than the depth of the plurality of active trenches 102. As a result, an active trench from the plurality of active trenches 102 that is beyond the intersection point of the trench FET device 100A (or field oxide termination trench) can also be filled with the dielectric material, such as with a thick field oxide.

In accordance with an embodiment, the trench FET device 100A further includes at least one additional termination trench 108 and 110 at each end of the plurality of active trenches 102, arranged parallel to the two or more termination trenches 104 and 106. In an example, at least one additional termination trench 108 and 110 is defined based on blocking voltage requirements. Moreover, at least one additional termination trench 108 and 110 that is arranged at each end of the plurality of active trenches 102 is not filled with the dielectric material.

In accordance with an embodiment, the trench FET device 100A further includes one or more parallel termination trenches 112 and 114 extending along the first axis. In other words, the one or more parallel termination trenches 112 and 114 are in parallel to the plurality of active trenches 102. In an example, one or more parallel termination trenches 112 and 114 have the same thickness of the dielectric material (or field oxide) as used inside the plurality of active trenches 102.

The trench FET device 100A includes the plurality of active trenches 102 that are terminated directly to the two or more termination trenches 104 and 106. Moreover, the two or more termination trenches 104 and 106 are used to increase the voltage blocking capability of the trench FET device 100A. As a result, the trench FET device 100A offers the benefit of eliminating the need for a transition region (or a robust termination region) without the direct current (DC) gap. In addition, each active trench from the plurality of active trenches 102 of the trench FET device 100A includes the gate electrode and the shield electrode that is used to reduce a gate-drain capacitance.

Figure 1B:
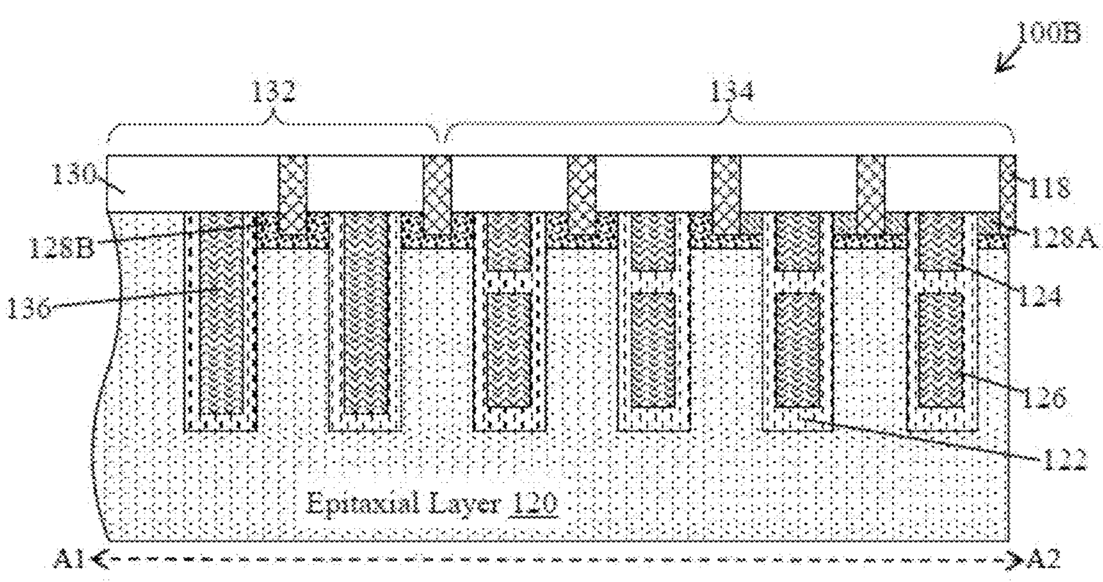
FIG. 1B is a cross-section view of a parallel termination trench to an active trench of a trench FET device, in accordance with an embodiment of the present disclosure.

FIG. 1B is a cross-section view of a parallel termination trench to an active trench of a trench FET device, in accordance with another embodiment of the present disclosure. FIG. 1B is described in conjunction with elements from FIG. 1A. With reference to FIG. 1B there is shown a cross-section view of a parallel (or vertical) termination trench (A1) to an active trench (A2) of a trench FET device 100B that includes an epitaxial layer 120, an end region 122, a gate electrode 124, a shield electrode 126, a source (N+) region 128A, and a body (P) region terminal 128B. There is further shown a tetraethyl orthosilicate (TEOS) layer 130, an edge termination region 132, an active region 134, and a single electrode 136.

In an implementation, a substrate is arranged initially, and then the epitaxial layer 120 is formed on the substrate. Thereafter, the gate electrode 124, the shield electrode 126, and the single electrode 136 are formed in the epitaxial layer 120. For example, the gate electrode 124, and the shield electrode 126 are formed in the active region 134, while the single electrode 136 is formed in the edge termination region 132. Thereafter, the source (N+) region 128A, the body (P) region 128B, and the TEOS layer 130 are formed on the epitaxial layer 120. In an implementation, each parallel termination trench includes the single electrode 136 with the same proportions as the combined gate electrode 124 and the shield electrode 126 of each active trench.

Figure 1C:
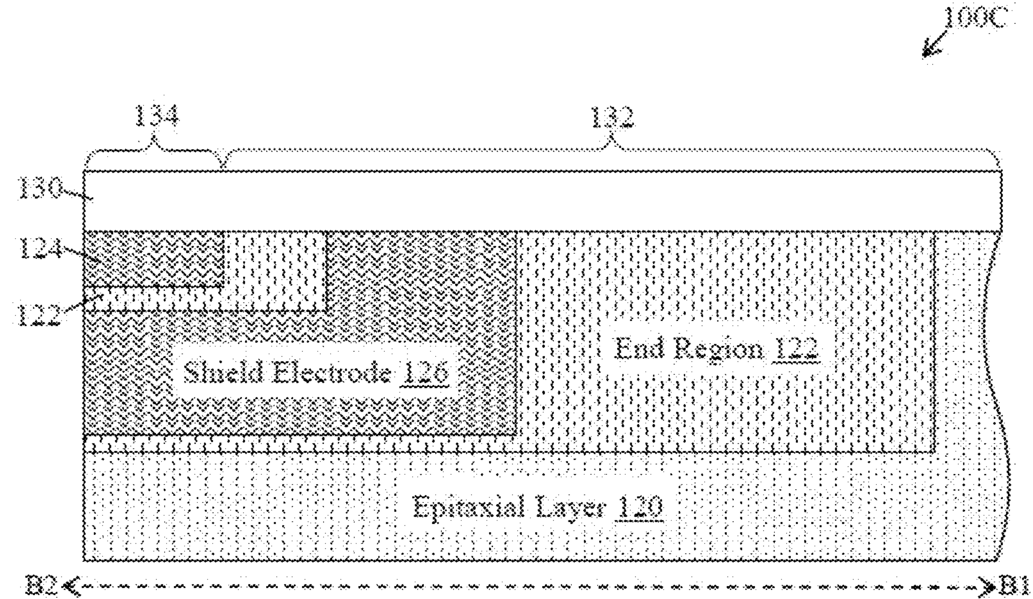
FIG. 1C is an illustration of a trench FET device, in accordance with an embodiment of the present disclosure.

FIG. 1C is an illustration of a trench FET device, in accordance with another embodiment of the present disclosure. FIG. 1C is described in conjunction with elements from FIGS. 1A, and 1B. With reference to FIG. 1C there is shown a trench FET device 100C that includes the epitaxial layer 120, the end region 122, the gate electrode 124, and the shield electrode 126. There is further shown the TEOS layer 130, the edge termination region 132, and the active region 134.

The shield electrode 126 of each of the plurality of active trenches 102 is arranged to abut with a respective one of the two or more termination trenches 104 and 106 at each end. With reference to FIG. 1C, there is shown that the shield electrode 126 is arranged from B2 to B1 (i.e., the shield electrode 126 is arranged along the first axis). There is further shown a vertical portion of the shield electrode 126, and the vertical portion extends towards the TEOS layer 130. The vertical portion of the shield electrode 126 of each of the plurality of active trenches 102 is arranged to abut with a respective one of the two or more termination trenches 104 and 106 at each end. In an implementation, the vertical portion of the shield electrode 126 may also be referred to as an abutting termination trench.

In accordance with an embodiment, one or more of the plurality of active trenches 102 comprises an end region 122 extending beyond the abutting termination trench, and the end region 122 is fully filled with a dielectric material. In an implementation, an achievable breakdown voltage of the trench FET device 100A primarily depends on the dielectric material that is filled within the end region 122 of the one or more of the plurality of active trenches 102. In other words, a trench beyond the intersection point is completely filled with the dielectric material, such as with a thick field oxide. The dielectric material is useful to support an electrical field potential from the plurality of active trenches 102 at an intersection point of the trench FET device 100A.

Figures 1D, 1E:
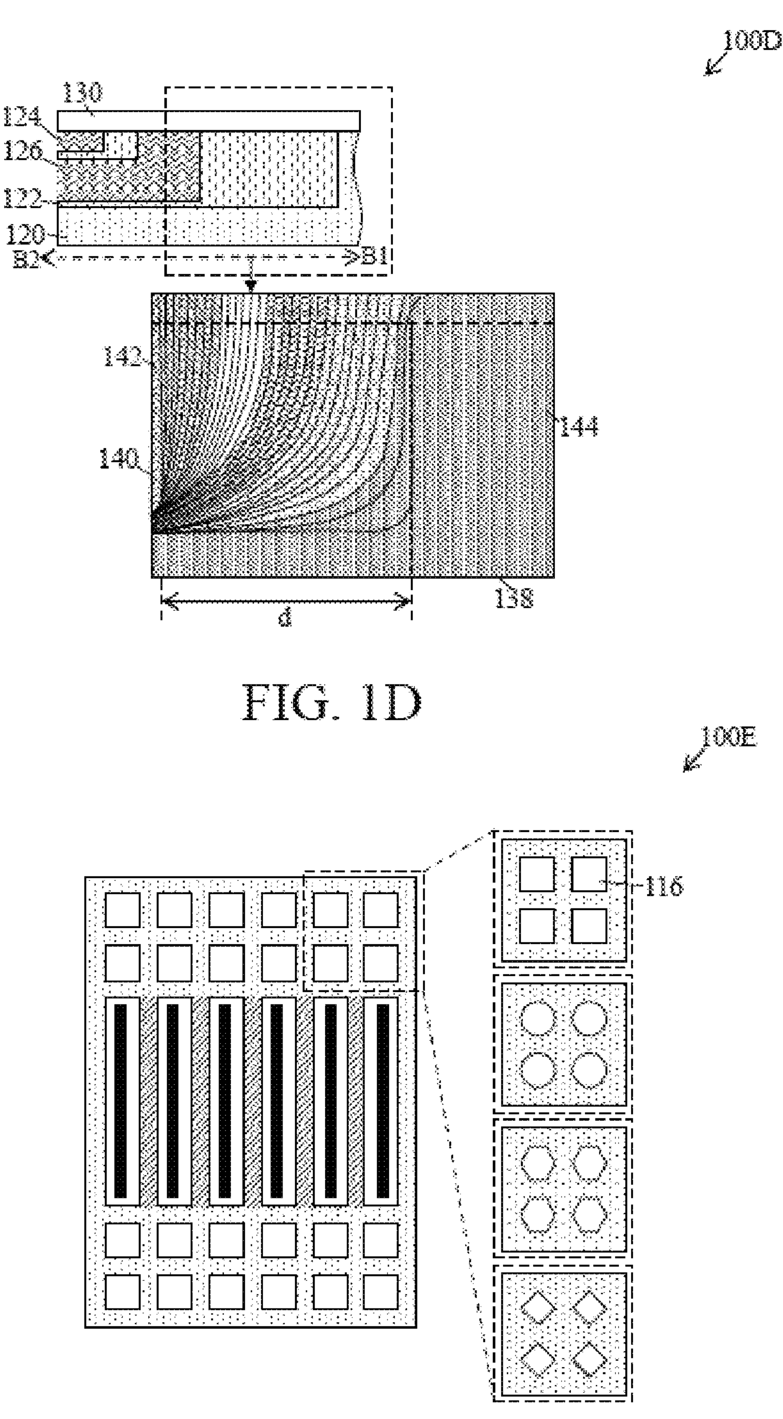
FIG. 1D is a graphical representation that depicts an electrostatic potential distribution under breakdown for a FET device, in accordance with an embodiment of the present disclosure.
FIG. 1E is an illustration of a trench FET device, in accordance with an embodiment of the present disclosure.

FIG. 1D is a graphical representation that depicts an electrostatic potential distribution under breakdown for a FET device, in accordance with an embodiment of the present disclosure. With reference to FIG. 1D there is shown a graphical representation 100D that depicts an electrostatic potential distribution under breakdown for the trench FET device 100C (of FIG. 1C). The graphical representation 100D includes an x-axis 138, a y-axis 140, a first region 142, and a second region 144. There is further shown the trench FET device 100C that includes the epitaxial layer 120, the end region 122, the gate electrode 124, the shield electrode 126, and the TEOS layer 130.

The graphical representation 100D depicts the electrostatic potential (in volts) under breakdown for the trench FET device 100C. The electrostatic potential in the first region 142 is minimum at different values of the x-axis 138 with respect to the y-axis 140. In an example, a contact, such as the source contact 118 is made to the shield electrode 126 (or shield electrode 126), and resulting electrostatic potential is spread in the first region 142. In addition, the electrostatic potential in the second region 144 is maximum at different values of the x-axis 138 with respect to the y-axis 140. The electrostatic potential in the second region 144 depends on the width (d) of the end region 122, and also on the dielectric material that is filled within the end region 122. Moreover, the amount of the electrostatic potential in between the first region 142 and the second region 144 is variable.

FIG. 1E is an illustration of a trench FET device, in accordance with another embodiment of the present disclosure. FIG. 1E is described in conjunction with elements from FIGS. 1A, 1B, and 1C. With reference to FIG. 1E there is shown a trench FET device 100E that includes one or more vertices 116.

In an implementation, one or more vertices 116 are formed at an intersection between an active trench, and a termination trench is formed with a rounded or angled form. In an implementation, the one or more vertices 116 are formed with a rounded form, such as a circular form. In another implementation, the one or more vertices 116 are formed with an angled form, such as a square form, a hexagonal form, or a diamond form.

FIG. 2 is a flow chart of a method of manufacturing a trench FET device, in accordance with another embodiment of the present disclosure. FIG. 2 is described in conjunction with elements from FIGS. 1A, 1B, 1C, 1D, and 1E. With reference to FIG. 2, there is shown a flow chart of a method 200 of manufacturing the trench FET device 100A (or the trench FET devices 100B, 100C, 100E). The method 200 includes steps 202 to 208.

There is provided the method 200 of manufacturing the trench FET device 100A, where the method 200 is used to manufacture the plurality of active trenches 102, the two or more termination trenches 104 and 106, and at least one additional termination trench 108 and 110, that is filled with a dielectric material.

At step 202, the method 200 comprises, forming an epitaxial layer 120 on a substrate. Firstly, the substrate is arranged, and then the epitaxial layer 120 is formed on the substrate, as further shown and described in FIG. 4A.

At step 204, the method 200 comprises, removing material from the epitaxial layer 120 to form a plurality of active trenches 102 extending along a first axis and distributed along a second axis perpendicular to the first axis, and to form the two or more termination trenches 104 and 106 extending along the second axis and arranged adjacent to the plurality of active trenches 102. In other words, the material is removed (e.g., via etching) from the epitaxial layer 120, which results in the formation of the plurality of active trenches 102 and the two or more termination trenches 104 and 106. The plurality of active trenches 102 is perpendicular to the two or more termination trenches 104 and 106. In an example, one or more parallel termination trenches 112 and 114 are also formed in addition to the two or more termination trenches 104 and 106.

At step 206, the method 200 comprises fully filling the two or more termination trenches 104 and 106 with a dielectric material. In an implementation, only a termination trench from the two or more termination trenches 104 and 106 that is directly connected to the plurality of active trenches 102 is filled with the dielectric material (e.g., a thick field oxide). In an example, the trench FET device 100A needs just one extra mask to manufacture the two or more termination trenches 104 and 106 that are filled with the dielectric material.

In an implementation, the fully filling of the two or more termination trenches 104 and 106 comprises depositing a first dielectric layer to fully fill each of the termination trenches and the plurality of active trenches 102, depositing and developing a first mask to cover the two or more termination trenches 104 and 106, removing the first dielectric layer from the plurality of active trenches 102, and removing the first mask. Firstly, the first dielectric layer is deposited in the plurality of active trenches 102, and also in the two or more termination trenches 104 and 106. Thereafter, the first mask is deposited and developed on at least one termination trench from the two or more termination trenches 104 and 106. After that, the first dielectric layer is removed from the plurality of active trenches 102. In an example, the first dielectric layer is also removed from a termination trench. Thereafter, the first mask is removed from the upper surface of the epitaxial layer 120. As a result, the first dielectric layer is left only in the two or more termination trenches 104 and 106, as further shown in FIG. 4A. The two or more termination trenches 104 and 106 that are fully filled with the dielectric material are useful to increase voltage blocking capability of the trench FET device 100A, and also to support an electrical field potential from the plurality of active trenches 102 and at an intersection point of the trench FET device 100A.

In an implementation, depositing the first dielectric layer 408A further comprises removing the dielectric material from an upper surface of the epitaxial layer 120 to form a planed surface. In an example, an excess amount of the first dielectric layer is removed from the upper surface of the epitaxial layer 120 (i.e., an excess amount of the first dielectric layer is removed) so as to form the planed (or planarized) surface. As a result, it is easy to deposit and develop the first mask over the two or more termination trenches 104 and 106.

At step 208, the method 200 comprises forming the gate electrode 124 and the shield electrode 126 in each active trench, and the shield electrode 126 of each of the plurality of active trenches 102 is arranged to abut with a respective one of the two or more termination trenches 104 and 106 at each end. In other words, the gate electrode 124 and the shield electrode 126 are formed within each active trench from the plurality of active trenches 102. Firstly, the shield electrode 126 is formed, and then the gate electrode 124 is formed in each active trench. Moreover, as the shield electrode 126 of each of the plurality of active trenches 102 is arranged to abut with the respective one of the two or more termination trenches 104 and 106 at each end, thus the shield electrode 126 is beneficial to improve a degree of parallelism of the two or more termination trenches 104 and 106 at each end.

In an implementation, forming the gate electrode 124 and the shield electrode 126 comprises depositing a first conductive material into each of the plurality of active trenches 102, partially removing the first conductive material to form the shield electrode 126 in each of the active trenches, and depositing a second conductive material into each of the plurality of active trenches 102 to form the gate electrode 124 in each of the plurality of active trenches. Firstly, the first conductive material (e.g., polysilicon) is deposited into each of the plurality of active trenches 102. Thereafter, the first conductive material is removed partially, such as the first conductive material is left at bottom of each of the plurality of active trenches 102, so as to form the shield electrode 126 in each of the active trenches. After that, the second conductive material is deposited into each of the active trenches 102. As a result, the gate electrode 124 is formed in each of the plurality of active trenches 102.

In an implementation, depositing the first conductive material further comprises depositing a second dielectric layer to partially fill each of the active trenches before depositing the first conductive material, and removing the dielectric material and the first conductive material from an upper surface of the epitaxial layer 120 to form a planed surface after depositing the first conductive material. In other words, the second dielectric layer is deposited in each of the plurality of active trenches 102 before depositing the first conductive material. Firstly, the second dielectric layer is deposited to partially fill each of the plurality of active trenches 102, such as around an inner surface of the plurality of active trenches 102, as further shown and described in FIG. 4B. After that, the first conductive material is deposited in each of the plurality of active trenches 102, such as on the second dielectric layer. In addition, the dielectric material and the first conductive material are removed partially, such as only from the upper surface of the epitaxial layer 120. As a result, the planed surface is formed on the epitaxial layer 120. Thereafter, the second conductive material is deposited into each of the plurality of active trenches 102, which results in the formation of the gate electrode 124 in each of the plurality of active trenches 102.

In an implementation, the method 200 further comprises removing the dielectric material from the epitaxial layer 120 to form one or more parallel termination trenches 112 and 114 extending along the first axis. Moreover, depositing the first conductive material further comprises depositing the first conductive material into each parallel termination trench to form a single electrode 136 with the same proportions as the combined gate electrode 124 and the shield electrode 126 of each active trench. Further, partially removing the first conductive material further comprises depositing and developing a second mask to cover the parallel termination trenches, before partially removing the first conductive material, and removing the second mask after partially removing the first conductive material. Firstly, the first conductive material is deposited into each parallel termination trench to form the single electrode 136. The single electrode 136 is formed with the same proportions as the combined gate electrode 124 and the shield electrode 126 of each active trench from the plurality of active trenches 102. Thereafter, the second mask is deposited and developed on the upper surface of the epitaxial layer 120, such as over the single electrode 136, and also over the two or more termination trenches 104 and 106 that are fully filled with the dielectric material. After that, the first conductive material is removed partially from the plurality of active trenches 102. In an example, the first dielectric layer is also removed partially from the plurality of active trenches 102. After that, the second mask is also removed from the epitaxial layer 120. As a result, the one or more parallel termination trenches 112 and 114 are formed. After that, the second dielectric layer is deposited in the plurality of active trenches 102, such as to partially fill each of the plurality of active trenches 102.

In an implementation, depositing the second conductive material further comprises partially filling each of the plurality of active trenches 102 with a dielectric material and removing the dielectric material from an upper surface of the epitaxial layer 120 to form a planed surface before depositing the second conductive material. In an implementation, the dielectric material is initially filled in each of the plurality of active trenches 102. After that, the dielectric material is removed from the upper surface of the epitaxial layer 120 to form the planed surface. As a result, it is easy to deposit the second conductive material in each of the plurality of active trenches 102.

In accordance with an embodiment, partially filling each of the active trenches with the dielectric material comprises depositing a third dielectric layer to fully fill each of the plurality of active trenches 102, depositing and developing a third mask to cover trenches other than the active trenches, partially removing the third dielectric layer from the active trenches, and removing the third mask. In an implementation, the third dielectric layer acts as the dielectric material, which is deposited before depositing the second conductive material in each of the plurality of active trenches 102. The third dielectric layer is deposited to fully fill each of the plurality of active trenches 102. Thereafter, the third mask is deposited and developed to cover the one or more parallel termination trenches 112 and 114, and also to cover the two or more termination trenches 104 and 106 at each end. The third mask is beneficial to remove the excess of the third dielectric layer from each of the plurality of active trenches 102, such as to partially remove the third dielectric layer from the plurality of active trenches 102. At last, the third mask is also removed from the epitaxial layer 120.

In accordance with another embodiment, the method 200 further comprises depositing a fourth dielectric layer to cover the upper surface of the epitaxial layer 120 before depositing the second conductive material. Finally, the fourth dielectric layer is deposited to cover the upper surface of the epitaxial layer 120. Thereafter, the second conductive material is deposited into each of the plurality of active trenches 102, which results in the formation of the gate electrode 124 in each of the plurality of active trenches 102.

The method 200 of manufacturing the trench FET device 100A includes forming the plurality of active trenches 102 that are terminated directly to the two or more termination trenches 104 and 106. The two or more termination trenches 104 and 106 are used to increase the voltage blocking capability of the trench FET device 100A. As a result, the trench FET device 100A offers the benefit of eliminating the need for a transition region along with a robust termination region without the direct current (DC) gap. In addition, each active trench from the plurality of active trenches 102 of the trench FET device 100A includes the gate electrode 124 and the shield electrode 126 that are used to reduce a gate-drain capacitance.

The steps 202 to 208 are only illustrative, and other alternatives can also be provided where one or more steps are added, one or more steps are removed, or one or more steps are provided in a different sequence without departing from the scope of the claims herein.

Figure 3:
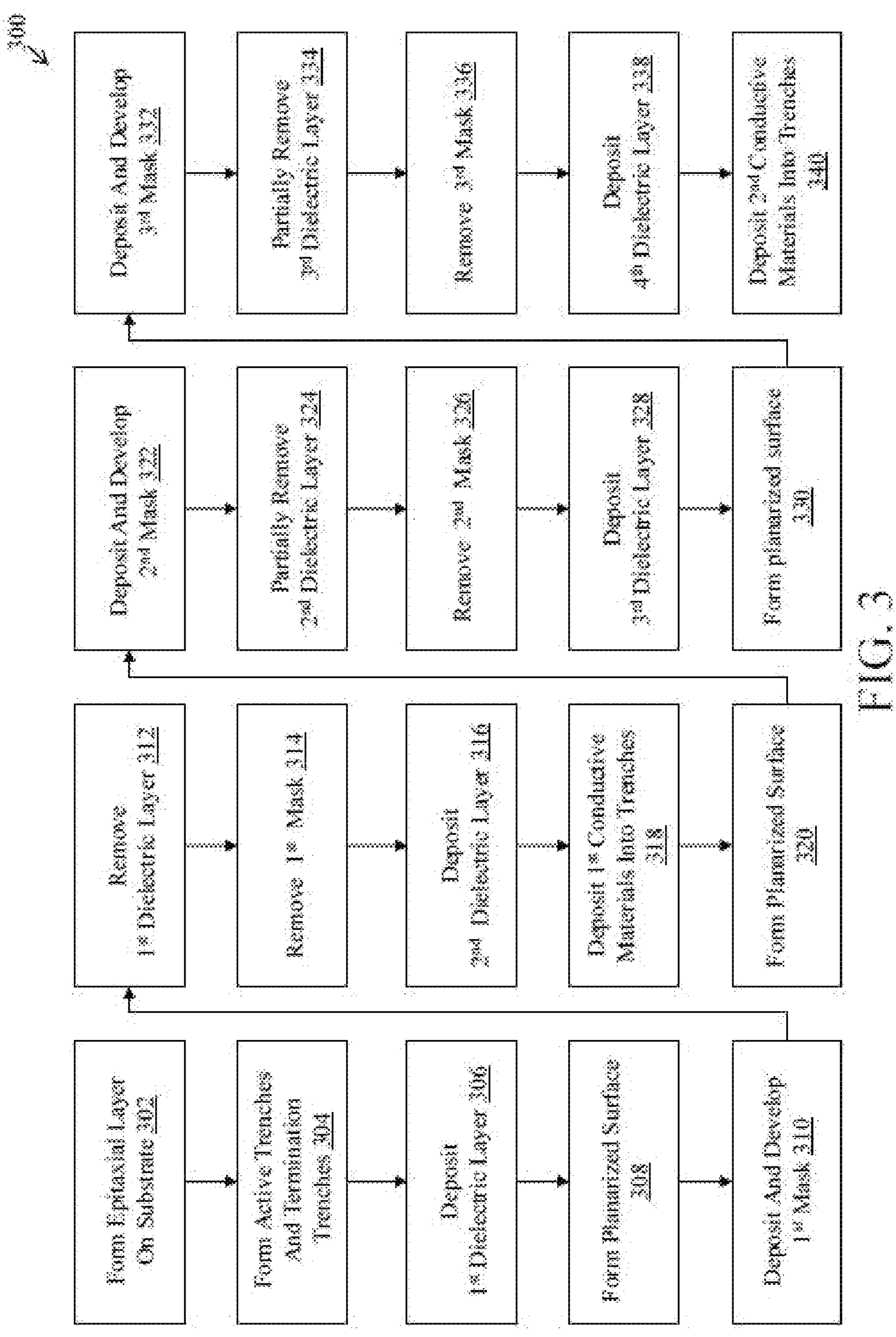
FIG. 3 is a flowchart of forming different types of trenches in a trench FET device, in accordance with an embodiment of the present disclosure.

FIG. 3 is a flowchart to form different types of trenches in a trench FET device, in accordance with an embodiment of the present disclosure. FIG. 3 is described in conjunction with elements from FIGS. 1A, 1B, 1C, 1D, 1E and 2. With reference to FIG. 3 there is shown a flow chart 300 to form different types of trenches in the trench FET device 100A (or the trench FET devices 100B, 100C, 100E). The flow chart 300 includes steps 302 to 340.

At step 302, the substrate is arranged, and then the epitaxial layer 120 is formed on the substrate.

At step 304, the plurality of active trenches 102 and the two or more termination trenches 104 and 106 are formed on the epitaxial layer 120. In an example, the two or more termination trenches 104 and 106, and the one or more parallel termination trenches 112 and 114 are also formed on the epitaxial layer 120.

At step 306, a first dielectric layer is deposited to fully fill each termination trenches, such as to fully fill the plurality of active trenches 102. In an example, the first dielectric layer is deposited in the two or more termination trenches 104 and 106, and also in the one or more parallel termination trenches 112 and 114.

At step 308, an excess amount of the first dielectric layer is removed from an upper surface of the epitaxial layer 120 so as to form a planarized surface.

At step 310, a first mask is deposited and developed to cover the two or more termination trenches 104 and 106.

At step 312, the first dielectric layer is removed from the plurality of active trenches 102. In an example, the first dielectric layer is also removed from a termination trench from one or more parallel termination trenches 112 and 114.

At step 314, the first mask is removed from the upper surface of the epitaxial layer 120. As a result, the first dielectric layer is left only in the two or more termination trenches 104 and 106.

At step 316, the second dielectric layer is deposited to partially fill each of the plurality of active trenches 102, such as around an inner surface of the plurality of active trenches 102.

At step 318, the first conductive material is deposited in each of the plurality of active trenches 102, such as over the second dielectric layer.

At step 320, the second dielectric layer and the first conductive material are removed from the upper surface of the epitaxial layer 120. As a result, the planed surface is formed on the epitaxial layer 120.

At step 322, a second mask is deposited and developed on the upper surface of the epitaxial layer 120, such as over the single electrode 136, and also over the two or more termination trenches 104 and 106 that are fully filled with the dielectric material.

At step 324, the second dielectric layer is removed partially, such as only from the upper surface of the epitaxial layer 120. In an example, the first conductive material is also removed in addition to the second dielectric layer. As a result, the planed surface is formed on the epitaxial layer 120.

At step 326, the second mask is removed from the epitaxial layer 120.

At step 328, a third dielectric layer is deposited to fully fill each of the plurality of active trenches 102.

At step 330, the third dielectric layer is removed partially, such as only from the upper surface of the epitaxial layer 120. As a result, the planed surface is formed on the epitaxial layer 120.

At step 332, a third mask is deposited and developed to cover trenches other than the plurality of active trenches 102, such as to cover the one or more parallel termination trenches 112 and 114, and also to cover the two or more termination trenches 104 and 106 at each end.

At step 334, the third dielectric layer is removed partially from the plurality of active trenches 102.

At step 336, the third mask is removed from the epitaxial layer 120.

At step 338, the fourth dielectric layer is deposited to cover the upper surface of the epitaxial layer 120.

At step 340, the second conductive material is deposited into each of the plurality of active trenches 102, which results in the formation of the gate electrode 124 in each of the plurality of active trenches 102.

The steps 302 to 340 are only illustrative, and other alternatives can also be provided where one or more steps are added, one or more steps are removed, or one or more steps are provided in a different sequence without departing from the scope of the claims herein.

Figure 4A:
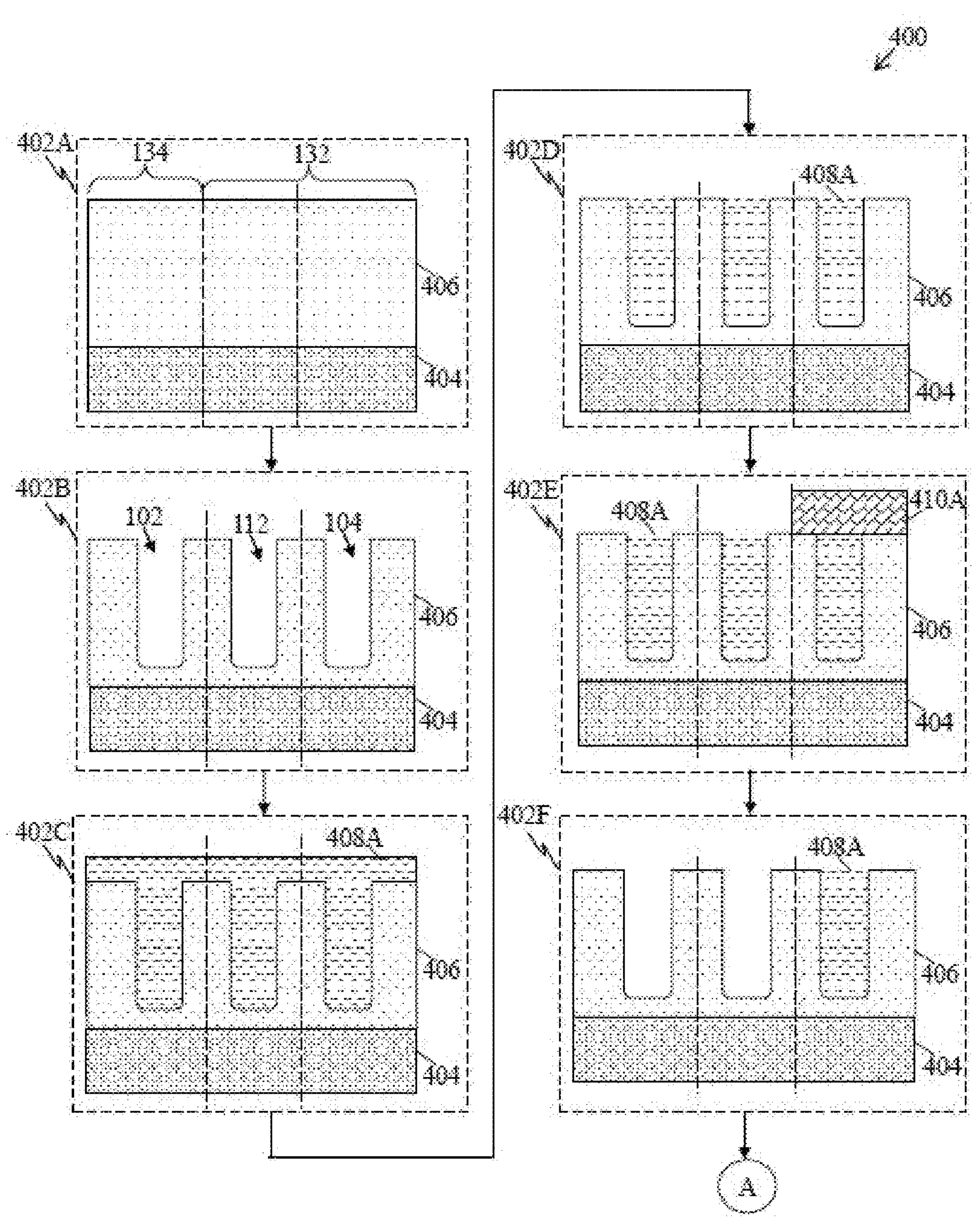
FIG. 4A, FIG. 4B, and FIG. 4C collectively is a diagram illustrating steps of manufacturing a trench FET device, in accordance with an embodiment of the present disclosure.
Figure 4B:
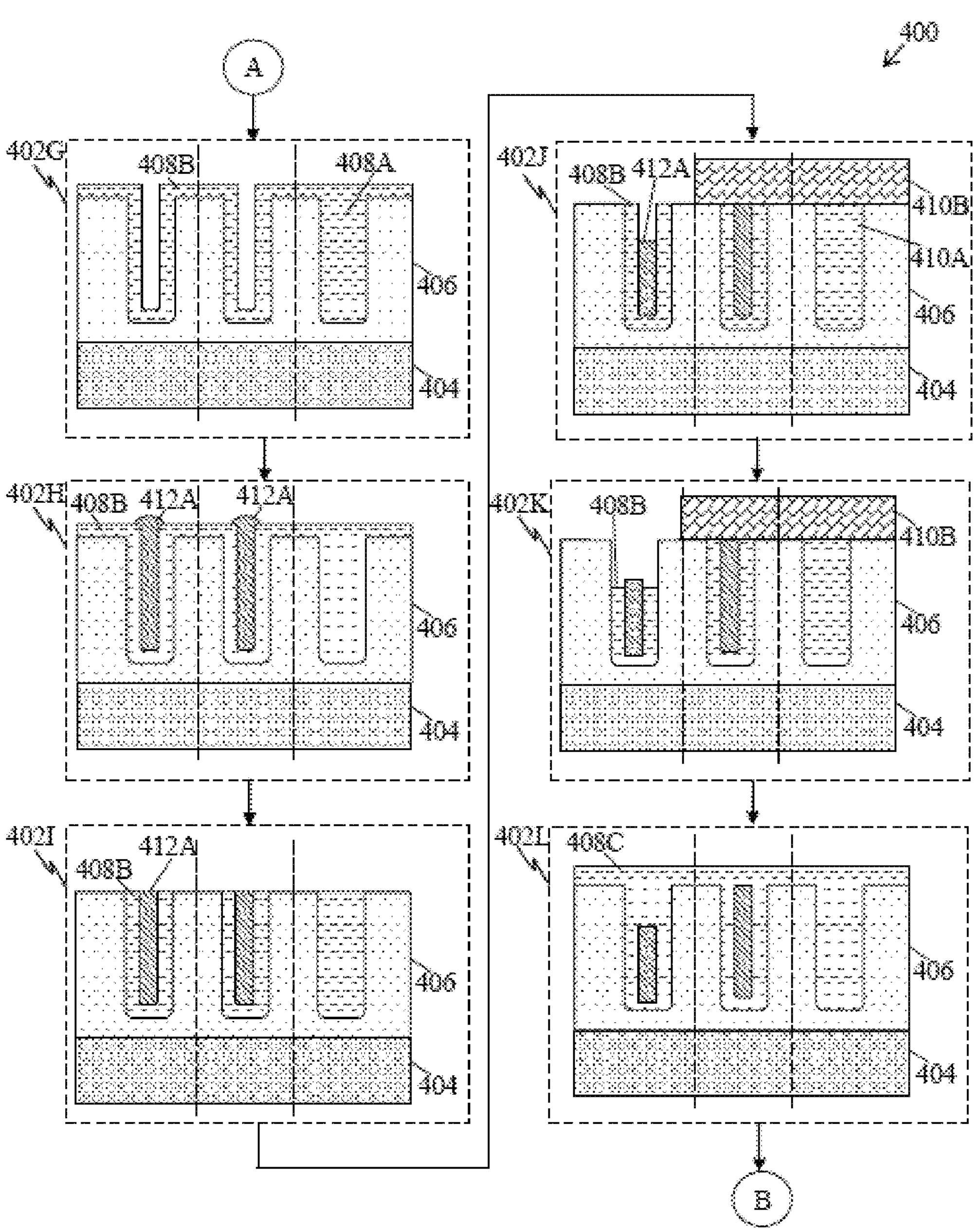
Figure 4C:
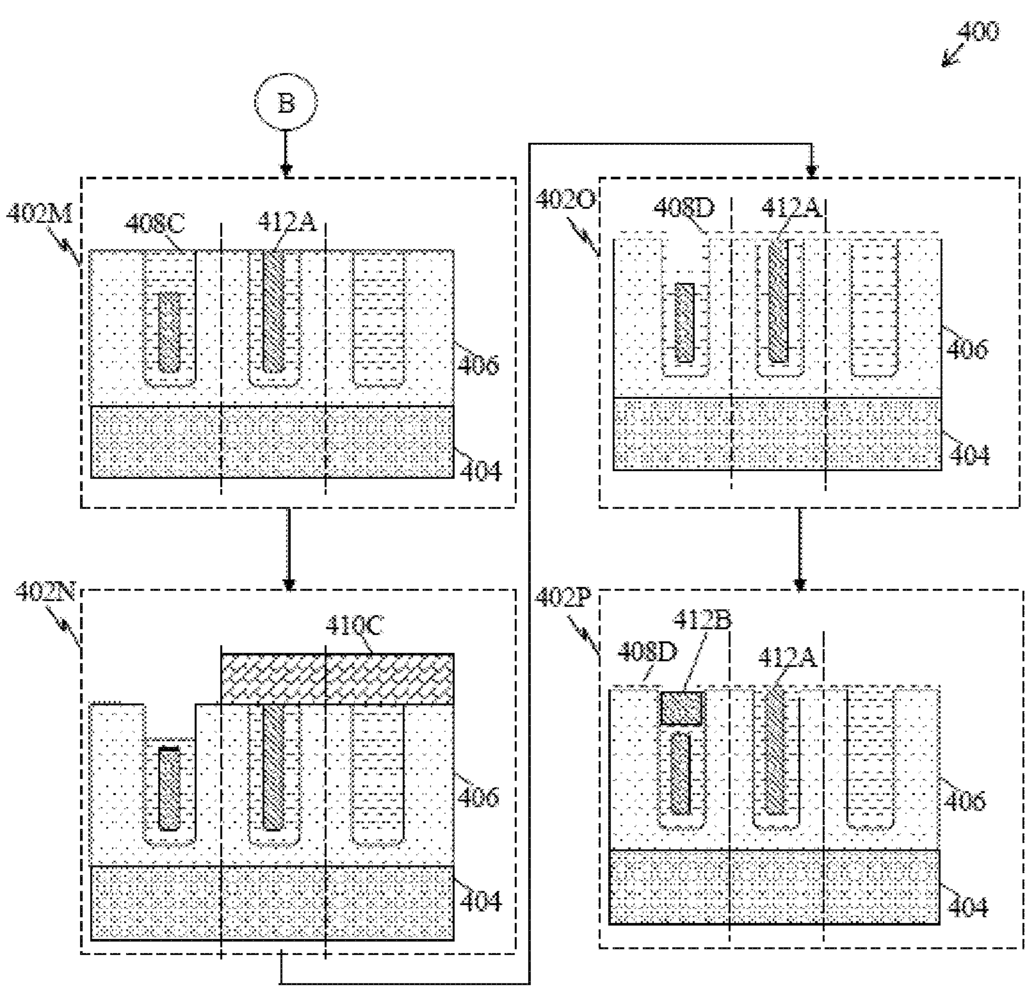

FIGS. 4A to 4C collectively is a diagram illustrating steps of manufacturing a trench FET device, in accordance with an embodiment of the present disclosure. With reference to FIGS. 4A to 4C, there are shown various steps of manufacturing a trench FET device 400.

With reference to the FIG. 4A, at step 402A, a substrate 404 is arranged, and then an epitaxial layer 406 is formed on the substrate 404. Moreover, the edge termination region 132, and the active region 134 are formed on the epitaxial layer 406.

At step 402B, an upper surface of the epitaxial layer 406, which results in the formation of the plurality of active trenches 102, the two or more termination trenches 104 and 106 (only the termination trench 104 is shown in FIG. 4A), and one or more parallel termination trenches 112 and 114 (only the termination trench 112 is shown in FIG. 4A). For example, the plurality of active trenches 102 is formed in the active region 134, while the two or more termination trenches 104 and 106, and one or more parallel termination trenches 112 and 114 are formed in the edge termination region 132.

At step 402C, a first dielectric layer 408A is deposited to fully fill each of the plurality of active trenches 102, the termination trench 104, and the parallel termination trench 112.

At step 402D, an excess amount of the first dielectric layer 408A is removed from the upper surface of the epitaxial layer 406 so as to form a planarized surface.

At step 402E, a first mask 410A is deposited and developed to cover the termination trench 104.

At step 402F, the first dielectric layer 408A is removed from the plurality of active trenches 102, and also from the parallel termination trench 112. In addition, the first mask 410A is also removed from the termination trench 104. As a result, the first dielectric layer 408A is left only in the termination trench 104.

With reference to the FIG. 4B, at step 402G, the second dielectric layer 408B is deposited to partially fill each of the plurality of active trenches 102, and the parallel termination trench 112, such as around an inner surface of the plurality of active trenches 102, and also around an inner surface of the parallel termination trench 112.

At step 402H, the first conductive material 412A is deposited in each of the plurality of active trenches 102, and also in the parallel termination trench 112, such as on the second dielectric layer 408B.

At step 402I, the second dielectric layer 408B and the first conductive material 412A are removed from the upper surface of the epitaxial layer 406. As a result, a planed surface is formed on the epitaxial layer 406. Moreover, the single electrode 136 (of FIG. 1B) is formed in the parallel termination trench 112.

At step 402J, the second mask 410B is deposited and developed on the upper surface of the epitaxial layer 120, such as over the single electrode 136, and also over the termination trench 104 that is fully filled with the first dielectric layer 408A.

At step 402K, the second dielectric layer 408B is removed partially, such as only from the upper surface of the epitaxial layer 406, and also from the plurality of active trenches 102. In an example, the first conductive material 412A is also removed in addition to the second dielectric layer 408B. As a result, the planed surface is formed on the epitaxial layer 406.

At step 402L, the second mask 410B is removed from the epitaxial layer 406. In addition, a third dielectric layer 408C is deposited to fully fill each of the plurality of active trenches 102. In an example, the third dielectric layer 408C is also deposited over the upper surface of the epitaxial layer 406.

With reference to the FIG. 4C, at step 402M, the third dielectric layer 408C is removed partially, such as only from the upper surface of the epitaxial layer 406. As a result, the planed surface is formed on the epitaxial layer 406.

At step 402N, a third mask 410C is deposited and developed to cover trenches other than the plurality of active trenches 102, such as to cover the parallel termination trench 112, and also to cover the termination trench 104. In addition, the third dielectric layer 408C is also removed partially from the plurality of active trenches 102, which results in the formation of the shield electrode 126 (of FIG. 1B) in each of the plurality of active trenches 102.

At step 402O, the third mask 410C is removed from the epitaxial layer 406. Thereafter, a fourth dielectric layer 408D is deposited to cover the upper surface of the epitaxial layer 406.

At step 402P, a second conductive material 412B is deposited into each of the plurality of active trenches 102, which results in the formation of the gate electrode 124 (of FIG. 1B) in each of the plurality of active trenches 102.

The steps 402A to 402P are only illustrative, and other alternatives can also be provided where one or more steps are added, one or more steps are removed, or one or more steps are provided in a different sequence without departing from the scope of the claims herein.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural. The word "exemplary" is used herein to mean "serving as an example, instance or illustration". Any embodiment described as "exemplary" is not necessarily to be construed as preferred or advantageous over other embodiments or to exclude the incorporation of features from other embodiments. The word "optionally" is used herein to mean "is provided in some embodiments and not provided in other embodiments". It is appreciated that certain features of the present disclosure, which are, for clarity, described in the context of separate embodiments, may also be provided in combination in a single embodiment. Conversely, various features of the disclosure, which are, for brevity, described in the context of a single embodiment, may also be provided separately or in any suitable combination or as suitable in any other described embodiment of the disclosure.

The invention claimed is:

1. A trench field-effect transistor (FET) device comprising:

a plurality of active trenches extending along a first axis and distributed along a second axis perpendicular to the first axis, wherein each of the active trenches comprises a gate electrode and a shield electrode; and a plurality of termination trenches extending along the second axis and, arranged adjacent to the active trenches, wherein each of the termination trenches is fully filled with a dielectric material, wherein the shield electrode is disposed to abut with a respective one of the termination trenches at each end of the shield electrode, wherein one or more of the active trenches further comprises an end region extending beyond the respective one of the termination trenches, and wherein the end region is fully filled with the dielectric material.

2. The trench FET device of claim 1, wherein a first depth of the termination trenches is equal to or greater than a second depth of the active trenches.

3. The trench FET device of claim 1, further comprising at least one additional termination trench at each end of the active trenches and arranged parallel to the termination trenches.

4. The trench FET device of claim 1, further comprising:

an intersection between a first active trench of the active trenches and a first termination trench of the termination trenches; and one or more vertices formed at the intersection and having a rounded form.

5. The trench FET device of claim 4, wherein the rounded form has a circular shape.

6. The trench FET device of claim 1, further comprising:

an intersection between a first active trench of the active trenches and a first termination trench of the termination trenches; and one or more vertices formed at the intersection and having an angled form.

7. The trench FET device of claim 6, wherein the angled form has a square shape, a hexagonal shape, or a diamond shape.

8. The trench FET device of claim 1, further comprising one or more additional termination trenches disposed outside the plurality of termination trenches and extending along the first axis, wherein each of the additional termination trenches comprises a single electrode with the same proportions as a combined structure of the gate electrode and the shield electrode.

9. The trench FET device of claim 1, wherein a width of the end region is less than or equal to a width of the respective active trench.

10. A method of manufacturing a trench field-effect transistor (FET) device and comprising:

forming an epitaxial layer on a substrate;

removing material from the epitaxial layer to form a plurality of active trenches extending along a first axis and distributed along a second axis perpendicular to the first axis and to form a plurality of termination trenches extending along the second axis and arranged adjacent to the active trenches;

depositing a first dielectric material to fully fill each of the termination trenches and the active trenches;

depositing and developing a mask to cover the termination trenches;

removing the first dielectric material from the active trenches;

removing the mask;

forming a gate electrode in each of the active trenches;

forming a shield electrode disposed in each of the active trenches to abut with a respective one of the termination trenches at each end of the shield electrode.

11. The method of claim 10, further comprising removing the first dielectric material from an upper surface of the epitaxial layer to form a planar surface.

12. The method of claim 10, wherein forming the gate electrode and the shield electrode comprises:

depositing a first conductive material into each of the active trenches;

partially removing the first conductive material to form the shield electrode in each of the active trenches; and depositing a second conductive material into each of the active trenches to form the gate electrode in each of the active trenches.

13. The method of claim 12, further comprising:

partially filling each of the active trenches with the first dielectric material; and removing the first dielectric material from an upper surface of the epitaxial layer to form a planar surface before depositing the second conductive material.

14. The method of claim 13, further comprising:

depositing a first dielectric layer to fully fill each of the active trenches;

depositing and developing a mask to cover trenches other than the active trenches;

partially removing the first dielectric layer from the active trenches; and removing the mask.

15. The method of claim 14, further comprising depositing a second dielectric layer to cover the upper surface before depositing the second conductive material.

16. The method of claim 12, wherein the first conductive material is polysilicon.

17. The method of claim 12, further comprising:

depositing a dielectric layer to partially fill each of the active trenches before depositing the first conductive material; and removing the first dielectric material and the first conductive material from an upper surface of the epitaxial layer to form a planar surface after depositing the first conductive material.

18. The method of claim 12, further comprising removing the first dielectric material from the epitaxial layer to form one or more parallel termination trenches extending along the first axis, wherein depositing the first conductive material comprises depositing the first conductive material into each of the one or more parallel termination trenches to form a single electrode with the same proportions as a combined structure of the gate electrode and the shield electrode, and wherein the method further comprises:

depositing and developing a mask to cover the one or more parallel termination trenches before partially removing the first conductive material; and removing the mask after partially removing the first conductive material.

19. The method of claim 10, wherein the first dielectric material comprises a thick field oxide.

20. The method of claim 10, wherein the active trenches and the termination trenches are formed simultaneously by a single masking and etching step.

* * * * *